United States Patent
Menezo et al.

(10) Patent No.: US 11,320,592 B2
(45) Date of Patent: May 3, 2022

(54) PROCESS FOR FABRICATING A PHOTONIC CHIP VIA TRANSFER OF A DIE TO A RECEIVING SUBSTRATE

(71) Applicant: Commissariat a l'Energie Atomique et aux Energies Alternatives, Paris (FR)

(72) Inventors: Sylvie Menezo, Grenoble (FR); Bertrand Szelag, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 17/078,277

(22) Filed: Oct. 23, 2020

(65) Prior Publication Data

US 2021/0124119 A1 Apr. 29, 2021

(30) Foreign Application Priority Data

Oct. 25, 2019 (FR) ...................... 19 11989

(51) Int. Cl.
*G02B 6/136* (2006.01)

(52) U.S. Cl.
CPC ................... *G02B 6/136* (2013.01)

(58) Field of Classification Search
CPC ........................ G02B 6/136; G02B 6/12004; G02B 6/12002; G02B 2006/12085; G02B 2006/12121; G02B 2006/12123; G02B 2006/12176; G02B 2006/12061; H01S 5/1032; H01S 5/2086; H01S 5/021; H01S 5/22; H01S 5/0215; H01L 31/1876; H01L 31/125; H01L 21/67775
See application file for complete search history.

(56) References Cited

U.S. PATENT DOCUMENTS

| | | | | |
|---|---|---|---|---|
| 10,312,661 | B2* | 6/2019 | Lambert | ............... H01L 24/03 |
| 2016/0291265 | A1 | 10/2016 | Kinghorn et al. | |
| 2016/0291269 | A1 | 10/2016 | Klein et al. | |
| 2018/0052290 | A1 | 2/2018 | Kinghorn et al. | |
| 2019/0179091 | A1 | 6/2019 | Kinghorn et al. | |
| 2019/0265413 | A1* | 8/2019 | Menezo | ............... G02B 6/136 |

FOREIGN PATENT DOCUMENTS

WO WO 2018/087485 A1 5/2018

OTHER PUBLICATIONS

French Preliminary Search Report dated Jul. 15, 2020 in French Application 19 11989 filed on Oct. 25, 2019 (with English Translation of Categories of Cited Documents & Written Opinion), 10 pages.

* cited by examiner

*Primary Examiner* — Anita K Alanko
(74) *Attorney, Agent, or Firm* — Oblon, McClelland, Maier & Neustadt, L.L.P.

(57) ABSTRACT

The invention relates to a process for fabricating a photonic chip including steps of transferring a die to an actual transfer region of the receiving substrate comprising a central region entirely covered by the die and a peripheral region having a free surface, a first waveguide lying solely in the central region, and a second waveguide lying in the peripheral region; depositing an etch mask on a segment of the die and around the actual transfer region; and dry etching a free segment of the die, the free surface of the peripheral region then being partially etched.

21 Claims, 6 Drawing Sheets

PROCESS FOR FABRICATING A PHOTONIC CHIP VIA TRANSFER OF A DIE TO A RECEIVING SUBSTRATE

TECHNICAL FIELD

The field of the invention is that of processes for fabricating photonic chips comprising a step of transferring at least one die to a functionalized receiving substrate.

PRIOR ART

Generally, a photonic chip comprises at least one optoelectronic component, a laser diode for example, that rests on a receiving substrate containing an integrated photonic circuit. Such an integrated photonic circuit comprises a waveguide that is optically coupled to the optoelectronic component, and active optical components (modulators, etc.) and/or passive optical components (multiplexers, etc.). In the case of silicon-photonics technologies, the optoelectronic component may be made based on a semiconductor, for example a III-V compound such as InP, and the receiving substrate may be a silicon-on-insulator (SOI) substrate.

The process for fabricating such a photonic chip may comprise a step of transferring a die to the receiving substrate. The die is a block made based on a semiconductor, and comprises a stack of a plurality of semiconductor layers. The transfer is carried out so that the die is deposited in a region referred to as the transfer region of the upper face of the receiving substrate, then at least partially covering an integrated waveguide. A step of structuring the III-V die is then carried out to produce the optoelectronic component, the latter then being optically coupled to the integrated waveguide. Generally, the optoelectronic component may be a laser diode, a photodiode, and electro-absorption modulator, inter alia. When numerous photonic chips are produced simultaneously on the same receiving substrate, they are then singulated by dicing the receiving substrate.

Patent application WO2018/087485A1 describes an example of such a fabricating process. It mentions the fact that the transfer of the die to the receiving substrate may be subject to a nonzero positioning uncertainty $d_{ip}$. In addition, the die may comprise a growth substrate, which may be removed by wet etching, after the transferring step. This wet etching may result in a lateral over-etch $d_{sgl}$ of the die in a plane parallel to the plane of the receiving substrate. Thus, if the die is, in the end, to have the desired dimensions ($Lv^{(f)}$, $lv^{(f)}$), in order to allow the one or more optoelectronic components to be produced, for example dimensions equal to 1×1 mm², it is important to take into account the positioning uncertainty $d_{ip}$ and the lateral over-etch $d_{sgl}$, and therefore to transfer a die having larger initial dimensions ($Lv^{(i)}$, $lv^{(i)}$), for example of about 2×2 mm². Moreover, there is a need to improve this type of fabricating process.

SUMMARY OF THE INVENTION

The objective of the invention is to at least partially remedy the drawbacks of the prior art, and more particularly to provide a process for fabricating a photonic chip that preserves the structural integrity of the one or more integrated waveguides optically coupled to the optoelectronic component.

To this end, the subject of the invention is a process for fabricating a photonic chip comprising at least one optoelectronic component placed on a receiving substrate and optically coupled to a first integrated waveguide, the process comprising the following steps:

defining a central region Zc, on an upper face of the receiving substrate, having a predefined dimensions Lc, lc in the plane of the receiving substrate, said region being intended to be entirely covered by a die following a step of transferring the latter to the receiving substrate after allowance for a predefined uncertainty $d_{ip}$ in the positioning of the die about the central region Zc;

producing the die, with initial dimensions $Lv^{(i)}$, $lv^{(i)}$ that are preset on the basis of the dimensions Lc, lc and of the positioning uncertainty $d_{ip}$;

producing the receiving substrate, the upper face comprising the central region Zc, and a peripheral region Zp encircling the central region Zc and intended to be partially covered by the die following the transferring step, these together forming an actual transfer region $Zr_e$ in which the die is intended to be entirely located, the receiving substrate comprising:

the first waveguide, which lies solely in the central region Zc; and a second waveguide, which is superposed on and optically coupled to the first waveguide, and which lies at least in the peripheral region Zp and has a spacing $e_{gap}^{(2)}$, with respect to the upper face, larger than a preset threshold value $P_{th}$;

transferring the die to the actual transfer region $Zr_e$ of the receiving substrate, the central region Zc then being entirely covered by the die, and the peripheral region Zp then having a free surface not covered by the die;

depositing an etch mask, on the one hand on a segment of the die, and on the other hand around the actual transfer region $Zr_e$;

producing the optoelectronic component from the die, by dry etching of a free segment of the die that is not coated by the etch mask, the free surface of the peripheral region Zp then being etched to a depth $P_{sgv}^{(a)}$ smaller than or equal to the threshold value $P_{th}$.

The following are certain preferred but nonlimiting aspects of this fabricating process.

The first waveguide may have a spacing $e_{gap}^{(1)}$, with respect to the upper face, smaller than the preset threshold value $P_{th}$. The spacing is defined along an axis orthogonal to the plane of the receiving substrate.

The receiving substrate may comprise a third waveguide, which is superposed on and optically coupled to the second waveguide, and which lies at least in the actual transfer region $Zr_e$ and has a spacing $e_{gap}^{(3)}$, with respect to the upper face, smaller than the preset threshold value $P_{th}$. The third waveguide may have a spacing $e_{gap}^{(3)}$ equal to $e_{gap}^{(1)}$.

Following the step of producing the die, the latter may have initial dimensions $Lv^{(i)}$, $lv^{(i)}$ at least equal to $Lc+2d_{ip}$, $lc+2d_{ip}$, respectively.

The actual transfer region $Zr_e$ may have dimensions $Lr_e$, $lr_e$ at least equal to $Lc+4d_{ip}$, $lc+4d_{ip}$, respectively.

The fabricating process may comprise, before the step of producing the optoelectronic component, a step of removing a growth substrate of the die by wet etching, the latter resulting in lateral over-etching of the die in a plane parallel to the receiving substrate over a nonzero distance $d_{sgl}$, the die then having initial dimensions $Lv^{(i)}$, $lv^{(i)}$ that are furthermore preset on the basis of the distance $d_{sgl}$.

The fabricating process may comprise a step of producing a plurality of optoelectronic components from the same die, each optoelectronic component being coupled to the corresponding first waveguide.

The optoelectronic component may be a laser diode, a photodiode or an electro-optical modulator.

The die may be made based on a III-V semiconductor compound.

The optoelectronic component may be a DFB laser diode, a Bragg mirror being placed in the first waveguide.

The optoelectronic component may be a DBR laser diode, two Bragg mirrors bounding the optical cavity of the laser diode and being placed in second waveguides that are each coupled to one end of the first waveguide.

The fabricating process may ensure the simultaneous fabrication of a plurality of photonic chips from the same receiving substrate.

BRIEF DESCRIPTION OF THE DRAWINGS

Other aspects, aims, advantages and features of the invention will become more clearly apparent on reading the following detailed description of preferred embodiments thereof, which description is given by way of nonlimiting example, with reference to the appended drawings, in which.

DETAILED DESCRIPTION OF PARTICULAR EMBODIMENTS

In the figures and in the rest of the description, elements that are identical or similar have been referenced with the same references. In addition, the various elements are not shown to scale for the sake of clarity of the figures. Moreover, the various embodiments and variants are not exclusive of one another and may be combined together. Unless otherwise indicated, the term "substantially", "about" and "of" the order of mean to within 10%, and preferably to within 5%. Moreover, the terms "comprised between . . . and . . . " and equivalents are to be understood inclusive of limits, unless otherwise indicated.

The invention relates to a process for fabricating one or more photonic chips from a given die transferred to a functionalized receiving substrate.

A photonic chip is an optoelectronic device comprising at least one optoelectronic component resting on a receiving substrate and optically coupled to an integrated waveguide located in the receiving substrate. This waveguide forms one portion of an integrated photonic circuit.

The die comprises a semiconductor segment intended to allow the one or more optoelectronic components to be produced, this semiconductor segment being obtained by epitaxy from a growth substrate. The die may have initial dimensions ($Lv^{(i)}$, $lv^{(i)}$) in a plane parallel to the receiving substrate of the order of 1 to several square millimetres, and a thickness of the order of a few tens to a few hundred microns. Here, the length of the die will be denoted L and its width 1. The die may have a polygonal initial shape, a square or rectangular shape for example, or a circular or oval shape.

The optoelectronic component may notably be a laser diode or a photodiode. It is made based on a semiconductor, i.e. it mainly comprises the semiconductor in question. In may thus comprise a stack of thin layers made of various semiconductor compounds containing the semiconductor. Preferably, the optoelectronic component is of III-V type, and may be made based on InP or GaAs. The die is then referred to as a III-V die. The optoelectronic component may comprise a heterostructure formed from an n-doped layer, from a p-doped prayer, and from an intermediate active layer containing quantum wells.

The receiving substrate is said to be functionalized in the sense that it comprises at least one waveguide integrated into the substrate, i.e. produced on or under the upper face of the receiving substrate. It may also comprise other passive optical components (multiplexers or demultiplexers, fibre-optic couplers, etc.) and/or active optical components (modulators, etc.), optically coupled to one another so as to form the integrated photonic circuit. The receiving substrate may be an SOI substrate, i.e. it may comprise a thin layer of silicon and a carrier substrate made of silicon, between which is inserted an oxide layer referred to as the BOX (for buried oxide). The thin silicon layer may be covered with a thin layer allowing the die to be bonded to the upper face of the receiving substrate, for example an oxide layer in the case of bonding by molecular adhesion.

Generally, the photonic chip may be a transmitter Tx in which may be found laser diodes each coupled to one integrated waveguide, and, for example, modulators, at least one multiplexer, and a coupler to an optical fibre. The photonic chip may also be a receiver Rx comprising a coupler, a demultiplexer, and photodiodes. It may also be a transceiver comprising both laser diodes and photodiodes. In the rest of the description, purely by way of illustration, the photonic chip is a transmitter comprising at least one laser diode made of a III-V compound, said laser diode being optically coupled to a first waveguide of an integrated photonic circuit, this waveguide being integrated into a receiving substrate made based on silicon, for example of SOI type.

Moreover, the fabricating process employs at least one step of structuring the die by dry etching, so as to produce the one or more optoelectronic components. The dry etching consists in ion bombardment of the free surface of the die, i.e. the surface not protected by an etch mask (also known as a hard mask). It is essentially a physical etch that therefore has a highly anisotropic character. It may thus, for example, be a question of reactive ion etching (RIE) or of inductively coupled plasma RIE (ICP-RIE).

FIGS. 1A to 1F illustrate various steps of an example of a process for fabricating a photonic chip 1, allowing a local structural degradation, during a step of dry etching of the die 10, of the integrated waveguide 23 optically coupled to the optoelectronic component to be seen. In this example, the photonic chip 1 is here a transmitter, and the die 10 is intended to form at least one laser diode. The die 10 is a III-V type and is made based on InP, and the receiving substrate 20 is of SOI type.

An orthogonal three-dimensional direct coordinate system XYZ, in which the XZ-plane is a plane parallel to the plane of the receiving substrate 20, the Z-axis is oriented along the longitudinal axis of the integrated waveguide 23, the X-axis is oriented along the width of the waveguide 23, and the Y-axis is oriented from the receiving substrate 20 toward the die 10, is defined here and will be referred to in the rest of the description.

Figure 1A:
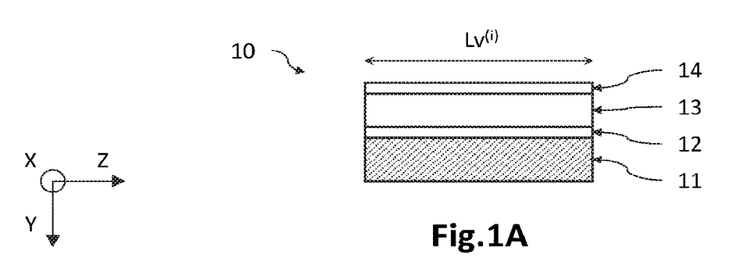
FIGS. 1A to 1F are schematic and partial cross-sectional views illustrating various steps of an example of a process for fabricating at least one photonic chip, allowing a local structural degradation of the integrated waveguide to be seen.

With reference to FIG. 1A, a die 10 from which the optoelectronic component, here a laser diode, will be formed is produced. The die 10 is here formed from a stack comprising a growth substrate 11 made of InP, a semiconductor layer doped according to a first conductivity type, here made of p-doped InP, an active layer 13 comprising quantum wells made of InGaAsP/InAsP, and a semiconductor layer 14 doped according to a second conductivity type opposite the first type, here made of n-doped InP.

The die 10 has initial dimensions ($Lv^{(i)}$, $lv^{(i)}$) in the XZ-plane, i.e. an initial length $Lv^{(i)}$ along the Z-axis and an initial width $lv^{(i)}$ along the X-axis. These initial dimensions ($Lv^{(i)}$, $lv^{(i)}$) here depend on a lateral over-etch $d_{sgl}$ of the die 10, which occurs during the removal of the growth substrate 11 by wet etching, and on desired final dimensions ($Lv^{(f)}$, $lv^{(f)}$) of the die 10. The final dimensions ($Lv^{(f)}$, $lv^{(f)}$) correspond to the dimensions of the die 10 before the step of dry etching carried out to form the optoelectronic component. By way of example, the desired final dimensions ($Lv^{(f)}$, $lv^{(f)}$) are 1×1 mm$^2$ and the lateral over-etch $d_{sgl}$ is here of the order of 100 µm. Thus, the initial dimensions ($Lv^{(i)}$, $lv^{(i)}$) are here at least equal to 1.2×1.2 mm$^2$. Final dimensions ($Lv^{(f)}$, $lv^{(f)}$) of 1×1 mm$^2$ notably allow a plurality of ridge laser diodes to be produced from the same die 10, as notably indicated in document WO2018/087485A1, each laser diode for example having a wavelength of about 800 µm, a width of about 50 µm, with an inter-diode spacing of about 200 µm.

Figure 1B:
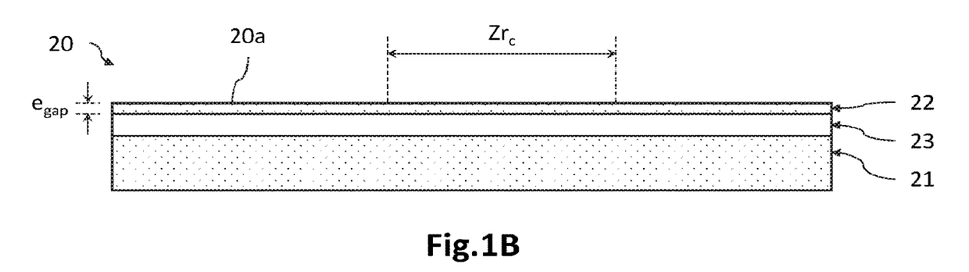

With reference to FIG. 1B, a receiving substrate 20 comprising at least one integrated waveguide 23 intended to be optically coupled to the optoelectronic component is produced. The substrate is here an SOI substrate. It comprises a carrier substrate (not shown) for example made of silicon and having a thickness of the order of several hundred microns, a layer 21 of buried oxide (BOX) that covers the carrier substrate, and an integrated waveguide 23. The waveguide 23 here has a core made of silicon and is encircled by an oxide. In this example, it is coated with a thin oxide layer 22, notably including a bonding layer, here made of silicon oxide, which defines the upper face 20a of the receiving substrate 20. It has a thickness of the order of a few tens of nanometres, for example a thickness comprised between about 20 nm and 100 nm. It is possible, as a variant, for this bonding layer to be absent. The waveguide 23, and more precisely its upper face, is spaced apart from the upper face 20a of the receiving substrate 20 by a distance $e_{gap}$ along the Y-axis that may be comprised between zero (no oxide layer 22 above the waveguide 23) and for example a few tens of nanometres.

Moreover, a target transfer region $Zr_c$ is defined on the upper face 20a of the receiving substrate 20, in which region the die 10 is intended to be located after the transferring step. This target transfer region $Zr_c$ here has dimensions identical to the initial dimensions ($Lv^{(i)}$, $lv^{(i)}$) of the die 10. The integrated waveguide 23 extends continuously through and out of the target transfer region $Zr_c$.

Figure 1C:
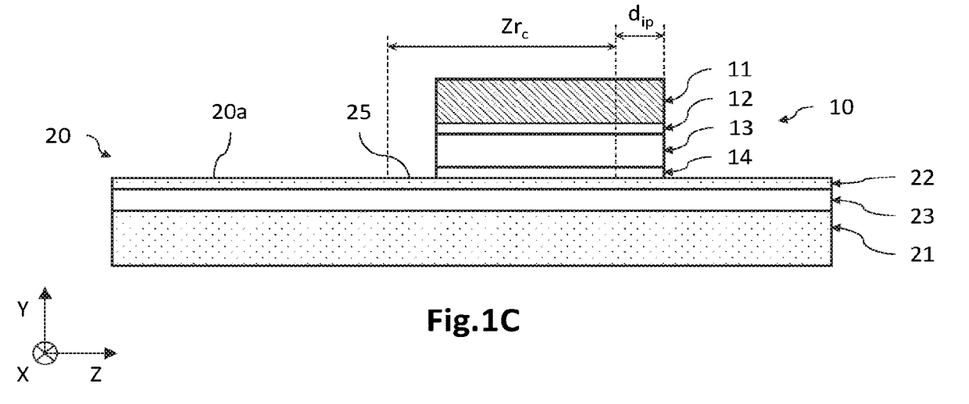

With reference to FIG. 1C, the die 10 is then transferred to the receiving substrate 20 in the target transfer region $Zr_c$, so as to cover the integrated waveguide 23. The die 10 is fastened to the receiving substrate 20 by oxide/oxide direct bonding. However, because of a positioning uncertainty $d_{ip}$ associated with the transferring device used, the die 10 is not placed exactly in the target transfer region $Zr_c$ but has an offset of a predefined value $d_{ip}$ that is for example indicated in the specifications of the transferring device. In this example, it is transferred with a positioning offset $d_{ip}$ of 300 µm in the +Z-direction. Thus, in the target transfer region $Zr_c$, the receiving substrate 20 has a free surface 25, i.e. a surface not covered by the die 10. Moreover, the die 10 comprises a segment located outside of the target transfer region $Zr_c$.

Figure 1D:
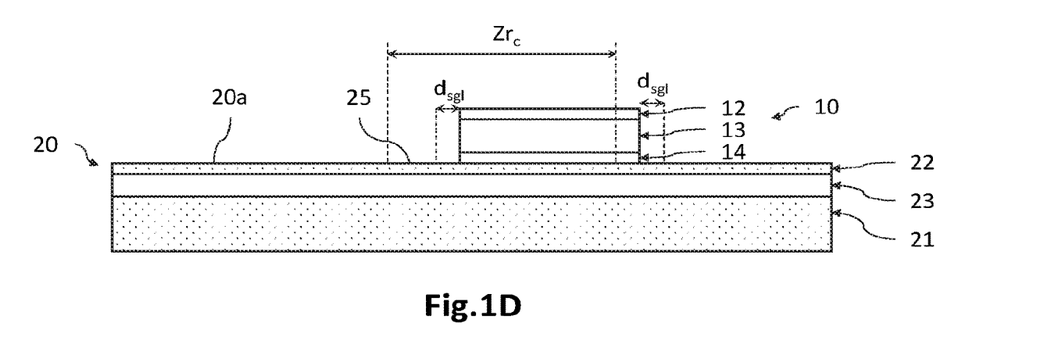

With reference to FIG. 1D, the growth substrate 11 is then removed, here by wet etching in hydrochloric acid, this optionally being preceded by mechanical thinning, so as to here free the p-doped semiconductor layer 12. This step of wet etching is here accompanied by lateral over-etching of the die 10 isotropically in the XZ-plane (the over-etch being of a value $d_{sgl}$ equal for example to about 100 µm) so that the die 10 then has final dimensions ($Lv^{(f)}$, $lv^{(f)}$) here equal to 1×1 mm$^2$.

Figure 1E:
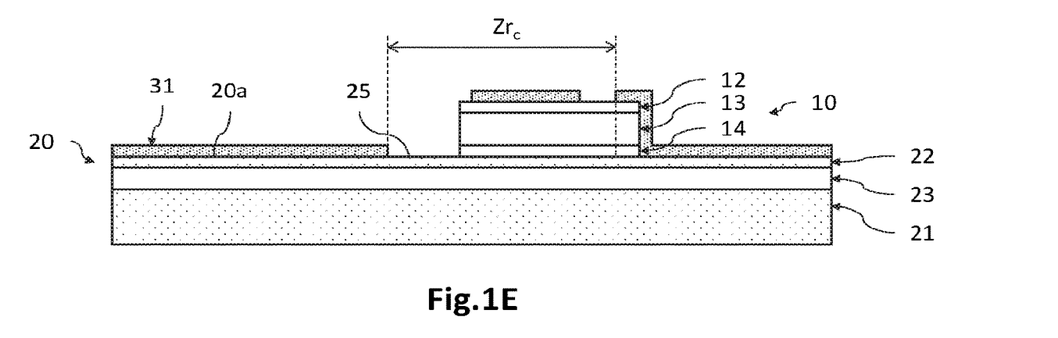

With reference to FIG. 1E, a hard mask 31, which is for example made of silicon nitride, is deposited so as, on the one hand, to encircle the target transfer region $Zr_c$, and on the other hand, to coat a segment of the die 10 intended to form the optoelectronic component. It may be seen that the hard mask 31 does not extend right up to the border of the die 10 in the XZ-plane: the receiving substrate 20 thus has, in the target transfer region $Zr_c$, a free surface 25 located between the hard mask 31 and the die 10. In addition, the hard mask 31 covers the segment of the die 10 located beyond the target transfer region $Zr_c$.

Figure 1F:
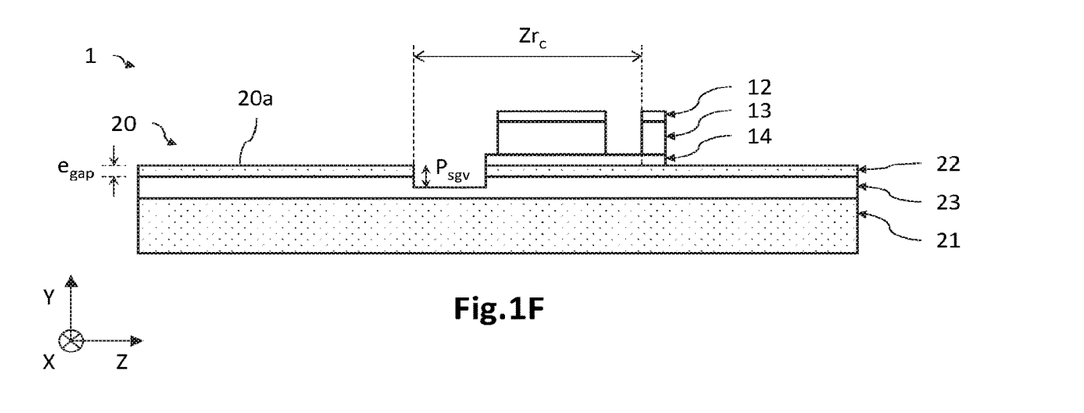

With reference to FIG. 1F, the die 10 is structured with a view to producing the optoelectronic component. To this end, dry etching is carried out to remove the segments of the die 10 not coated with the hard mask 31. The dry etching may, for example, be reactive ion etching (RIE). In this example, it is essentially anisotropic and here leads to a substantially zero lateral over-etch.

The inventors have observed that the positioning uncertainty $d_{ip}$ of the die 10 may lead to a local structural degradation of the integrated waveguide 23 in the target transfer region $Zr_c$. Specifically, in this example, the free surface 25 of the receiving substrate 20 may be etched to a depth $P_{sgv}$ the value of which notably depends on the operating conditions of the etch and on the nature of the etched materials. It may be seen that the value $P_{sgv}$ of this vertical over-etch may be larger than the spacing $e_{gap}$ between the waveguide 23 and the upper face 20a of the receiving substrate 20. The depth $P_{sgv}$ of the vertical over-etch may reach a value of about 75 nm, and thus lead to at least partial etching of the integrated waveguide 23 when the spacing $e_{gap}$ is smaller than this value $P_{sgv}$. Said integrated waveguide thus undergoes a local structural degradation that may lead to a decrease in the performance of the photonic chip 1. Moreover, this local deterioration of the integrated waveguide 23 may be accentuated when the fabricating process comprises at least one additional step of dry etching, for example during the structuring of the n-doped InP semiconductor layer 14. A new vertical over-etch of the receiving substrate 20, for example of a value of about 75 nm, may then occur, aggravating the local degradation of the structure of the integrated waveguide 23.

Moreover, as illustrated in FIG. 1F, the offset of the die 10 out of the target transfer region $Zr_c$ leads to the formation of one or more undesired wall(s) or pad(s). These parasitic regions of three-dimensional topology may cause disruption in subsequent steps of the fabricating process, whether these be steps of lithography and etching or steps of depositing a thin layer (notably to produce the biasing electrodes).

A process for fabricating a photonic chip 1 according to one embodiment will now be described with reference to FIGS. 2A to 2C, and 3A to 3I. This process allows the risks of degradation of the one or more integrated waveguides (which is directly or indirectly coupled to the optoelectronic component) during the vertical over-etch of the receiving substrate 20 to be avoided.

Figure 2A:
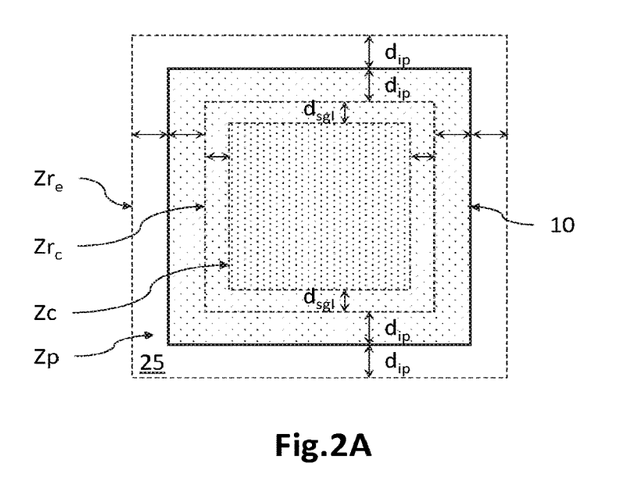
FIG. 2A is a schematic and partial view from above of a die transferred to a receiving substrate, allowing a central region Zc, a target transfer region $Zr_c$ and an actual transfer region $Zr_e$ to be seen.

With reference to FIG. 2A, a central region Zc of dimensions (Lc, lc) is defined on the upper face 20a of the receiving substrate 20, allowing the one or more optoelectronic components to be produced, this central region Zc being intended to be entirely covered by the die 10 following the transferring step, whatever the actual position of the die 10 because of the positioning uncertainty $d_{ip}$ about the central region Zc. In this example, the central region Zc has dimensions (Lc, lc) here equal to 1×1 mm² allowing a plurality of ridge diodes to be produced.

It is desired for the die 10, after the step of removing the growth substrate 11 by wet etching, to have final dimensions at least equal to (Lc, lc). The target transfer region $Zr_c$ therefore corresponds to the central region Zc increased by a distance $d_{sgl}$ related to the lateral over-etch that occurs during the wet etching of the growth substrate 11. This target transfer region $Zr_c$ is therefore centred on the central region Zc and has dimensions ($Lr_c$, lc) at least equal to (Lc+2$d_{sgl}$, lc+2$d_{sgl}$).

To take into account the positioning uncertainty of the die 10 about the target transfer region $Zr_c$, which is of a value $d_{ip}$ here equal to 300 μm, the die 10 has initial dimensions ($Lv^{(i)}$, $lv^{(i)}$) at least equal to ($Lr_c$+2$d_{ip}$, $lr_c$+2$d_{ip}$), and therefore at least equal to (Lc+2$d_{sgl}$+2$d_{ip}$, lc+2$d_{sgl}$+2$d_{ip}$), i.e. here at least equal to 1.8×1.8 mm². It is therefore possible to define an actual transfer region $Zr_e$ (also called effective transfer region $Zr_e$) as being the region in which the die 10 will be entirely located after the transferring step, given the positioning uncertainty $d_{ip}$ about the target transfer region $Zr_c$. This actual transfer region $Zr_e$ is therefore centred on the central region Zc and has dimensions ($Lr_e$, $lr_e$) at least equal to (Lc+2$d_{sgl}$+4$d_{ip}$, lc+2$d_{sgl}$+4$d_{ip}$), i.e. here at least equal to 2.4×2.4 mm².

In other words, the actual transfer region $Zr_e$ is the region of the receiving substrate 20, encircling the central region Zc, to which the die 10 will actually be transferred given the predefined positioning uncertainty $d_{ip}$ and here the predefined lateral over-etch $d_{sgl}$ related to the wet etch of the growth substrate 11. The die 10 will therefore be entirely located in this actual transfer region $Zr_e$, in the sense that it will not be partially located outside of this region $Zr_e$.

In addition, the transfer of a die 10 of initial dimensions ($Lv^{(i)}$, $lv^{(i)}$) defined beforehand to the actual transfer region $Zr_e$ allows it to be ensured that the central region Zc will indeed be entirely covered by the die 10 after the transferring step, and here also after the step of wet etching the growth substrate 11. In other words, the central region Zc will not comprise a free surface not covered by the die 10. The central region Zc is delineated by a peripheral border that is at a distance of a value $d_{sgl}$+2$d_{ip}$ from the peripheral border of the actual transfer region $Zr_e$.

The peripheral region Zp is the area of the actual transfer region $Zr_e$ that encircles the central region Zc. It is therefore intended to be only partially covered by the die 10 after the transferring step. Thus, it is intended to have a so-called free surface 25, i.e. a surface that is not covered by the die 10, which will be subjected to a vertical over-etch of a preset threshold depth $P_{th}$, in the step or steps of dry etching employed by the fabricating process.

Figure 2B:
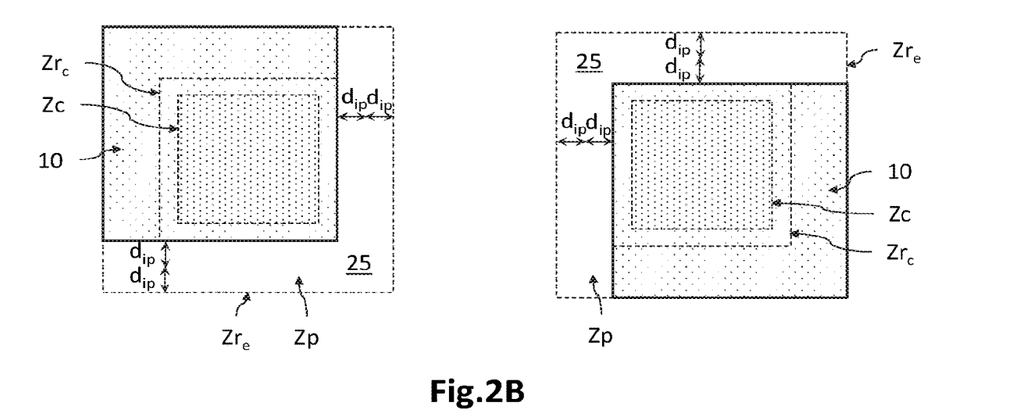
FIG. 2B is a schematic and partial view from above of two examples of dies transferred to a receiving substrate, before the step of wet etching the growth substrate, for two positions of the die in the actual transfer region $Zr_e$.

FIG. 2B illustrates two examples of positioning of the die 10 in the predefined actual transfer region $Zr_e$, before the step of wet etching the growth substrate 11. In one example, the die 10 is positioned in a corner (top left hand corner) of the actual transfer region $Zr_c$ and in the other example it is positioned in the opposite corner (bottom right hand corner). It will be noted that, whatever the positioning uncertainty of the die 10, the latter always covers the central region Zc, and here also the target transfer region $Zr_c$. The peripheral region Zp has a free surface 25 liable to experience a vertical over-etch in the dry etching step.

Figure 2C:
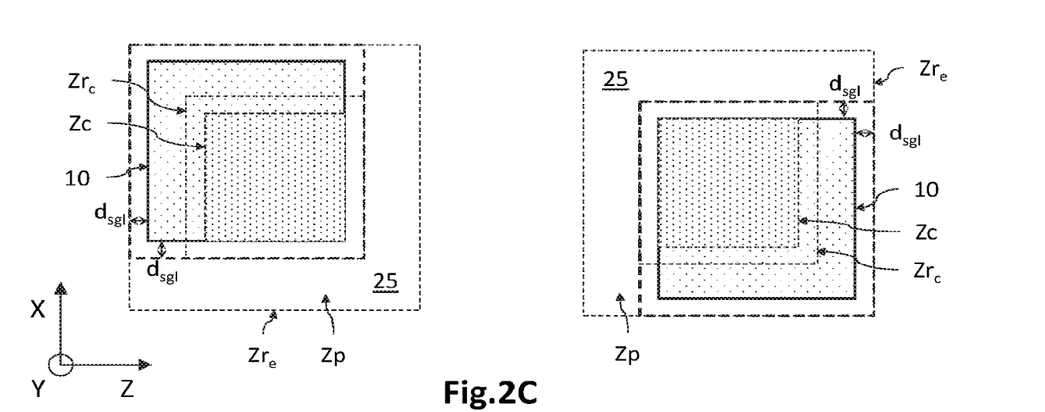
FIG. 2C is a schematic and partial view from above of two examples of dies, such as illustrated in FIG. 2B, transferred to a receiving substrate, after the step of wet etching the growth substrate.

FIG. 2C illustrates the two examples of positioning of the die 10 that are illustrated in FIG. 2B, but after the step of wet etching the growth substrate 11. The die 10 has therefore passed from initial dimensions ($Lv^{(i)}$, $lv^{(i)}$ to final dimensions ($Lv^{(f)}$, $lv^{(f)}$) that are smaller by the value $d_{sgl}$. Here, the die 10 again entirely covers the central region Zc but only partially covers the peripheral region Zp. A free surface 25 is therefore present, that will possibly experience the vertical over-etch.

FIGS. 3A to 3I illustrate various steps of the fabricating process according to the embodiment, allowing a local degradation of the structure of the integrated waveguides coupled to the optoelectronic component to be avoided.

Figure 3A:
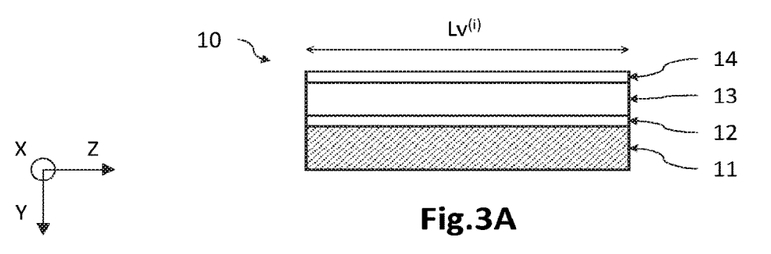
FIGS. 3A to 3I are schematic and partial cross-sectional views illustrating various steps of a process for fabricating at least one photonic chip according to one embodiment, allowing the local structural degradation of the first and second integrated waveguides to be avoided.

With reference to FIG. 3A, the die 10 is produced. The latter comprises, as above, a growth substrate 11, here made of InP, optionally a sacrificial layer made of InGaAs (not shown), a doped semiconductor layer 12, here made of p-doped InP, an active layer 13 comprising quantum wells, for example made of InAsP/InGaAsP, and a doped semiconductor layer 14, here made of n-doped InP. It has initial dimensions ($Lv^{(i)}$, $lv^{(i)}$ that take into account the dimensions Lc, lc of the central region Zc (here about 1×1 mm²), the positioning uncertainty $d_{ip}$ (here about 300 μm), and the lateral over-etch $d_{sgl}$ (here about 100 μm). In other words, the initial dimensions ($Lv^{(i)}$, $lv^{(i)}$ of the die 10 are at least equal to (Lc+2$d_{ip}$+2$d_{sgl}$)×(lc+2$d_{ip}$+2$d_{sgl}$), i.e. here at least equal to about 1.8×1.8 mm².

Figure 3B:
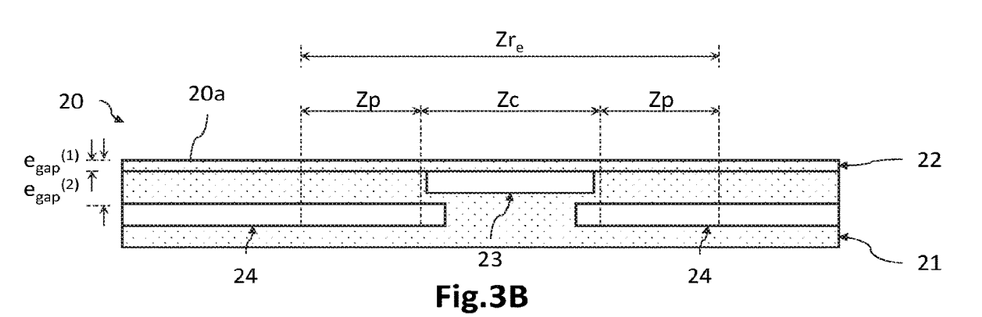

With reference to FIG. 3B, the receiving substrate 20 is produced. It here comprises a carrier substrate (not shown), for example made of silicon, a BOX oxide layer 21, at least two integrated waveguides 23, 24, and an oxide layer 22 spacing the waveguide 23 apart from the receiving substrate 20. More precisely, the receiving substrate 20 comprises:
  a first waveguide 23 intended to be optically coupled to the optoelectronic component, lying, in the XZ-plane, solely in the central region Zc, and having a spacing $e_{gap}^{(1)}$ along the Y-axis with respect to the upper face 20a of the receiving substrate 20 that may be smaller than or equal to the threshold value $P_{th}$, and
  at least one second waveguide 24 that is superposed along the Y-axis and optically coupled to the first waveguide 23, lying, in the XZ-plane, at least in the peripheral region Zp, and having a spacing $e_{gap}^{(2)}$ along the Y-axis with respect to the upper face 20a of the receiving substrate 20 larger than the threshold value $P_{th}$.

The first waveguide 23, which is intended to be optically coupled to the optoelectronic component, lies, in the XZ-plane, solely in the central region Zc. In other words, it does not extend into the peripheral region Zp. Because of its arrangement in the XZ-plane, and despite a potentially small spacing $e_{gap}^{(1)}$ with respect to the upper face 20a of the receiving substrate 20, which spacing is defined so as to optimize the optical coupling to the laser diode, it will not experience a local structural degradation by the vertical over-etching of the receiving substrate 20, no matter what the actual transfer position of the die 10 in the region $Zr_e$ as a result of the predefined positioning uncertainty $d_{ip}$, and no matter what the potential lateral over-etch of predefined value $d_{sgl}$ during the wet etching of the growth substrate 11. Specifically, it is not located in the peripheral region Zp and is therefore safe from the vertical over-etch related to the dry etching.

The second waveguide 24 is superposed, along the Y-axis, on the first waveguide 23, and is optically coupled thereto. It lies, in the XZ-plane, at least in the peripheral region Zp. It here also extends, on the one hand, out of the transfer region Zr, and on the other hand, also into the central region Zc over a distance allowing the optical coupling to the first waveguide 23 to be optimized. Because of its spacing $e_{gap}^{(2)}$, which is larger than the threshold value $P_{th}$, and despite lying in the peripheral region Zp, it is safe from the vertical over-etch of the receiving substrate 20. $P_{th}$ is defined as being the maximum value of the cumulative vertical over-etch undergone in the peripheral region Zp as a result of the one or more various steps of dry etching employed in the fabricating process.

Figure 3C:
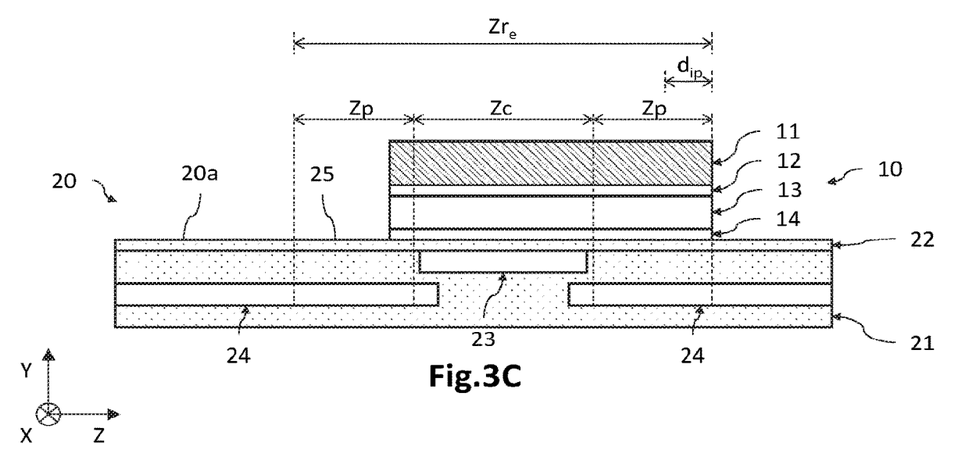

With reference to FIG. 3C, the die 10 is transferred to the receiving substrate 20 in the actual transfer region $Zr_e$. In this example, the die 10 is offset in the +Z-direction by a value $d_{ip}$ here equal to about 300 μm. It therefore remains located in the actual transfer region $Zr_e$ such as defined above, and necessarily completely covers the central region Zc. Thus, a surface of the receiving substrate 20 in the peripheral region Zp is a free surface 25, i.e. a surface not covered by the die 10.

Figure 3D:
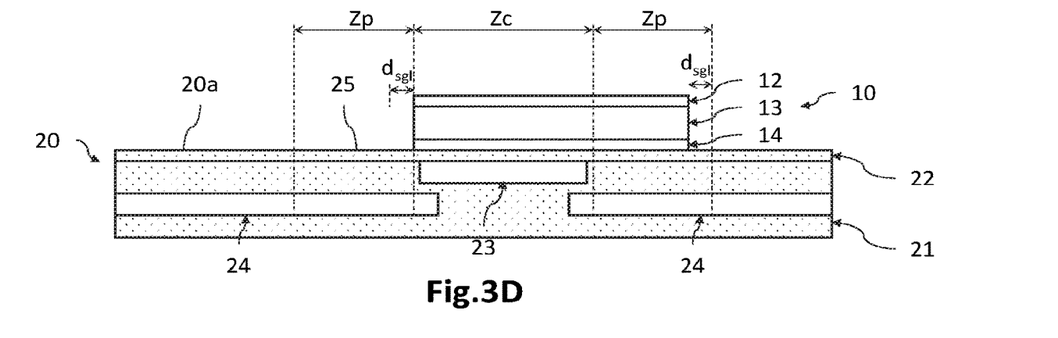

With reference to FIG. 3D, the growth substrate 11 is then removed, here by wet etching, so as to free the p-doped semiconductor layer 12. This step of wet etching is here accompanied by lateral over-etching of the die 10 in an isotropic manner, in the XZ-plane, of a value $d_{sgl}$ here equal to about 100 μm, so that the die 10 then has dimensions ($Lc+2d_{ip}$, $lc+2d_{ip}$), here equal to 1.6×1.6 mm².

Figure 3E:
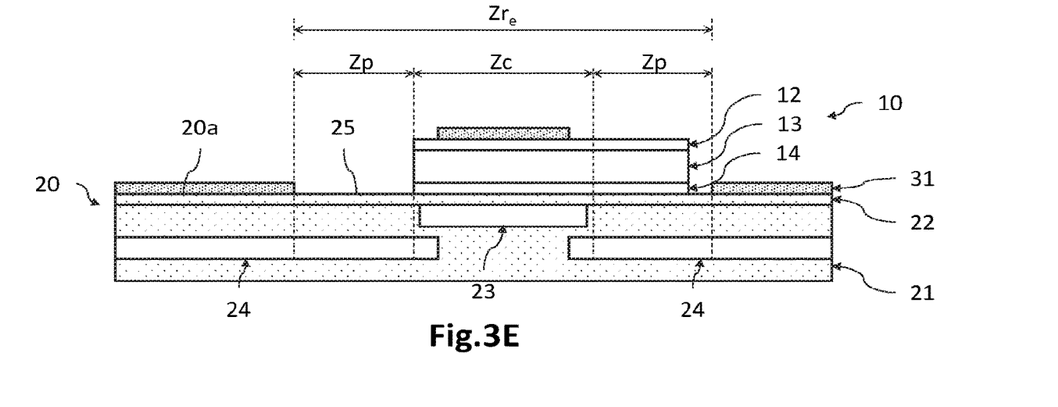

With reference to FIG. 3E, a hard mask 31, for example made of a silicon nitride, is deposited so as to continuously coat the surface of the receiving substrate 20 encircling the actual transfer region $Zr_e$, and to coat a segment of the die 10 that is intended to form the optoelectronic component (and which is therefore located in the central region Zc). Thus, the surface of the receiving substrate 20 is protected, outside of the actual transfer region $Zr_e$, by the hard mask 31, whereas the peripheral region Zp has a free surface 25, i.e. one that is not protected by the hard mask 31. In contrast, the central region Zc is still entirely covered by the die 10. Moreover, depositing the hard mask 31 around the actual transfer region $Zr_e$ and not around the target transfer region $Zr_c$ allows the production of undesired walls and/or pads, such as illustrated in FIG. 1F, to be avoided.

Figure 3F:
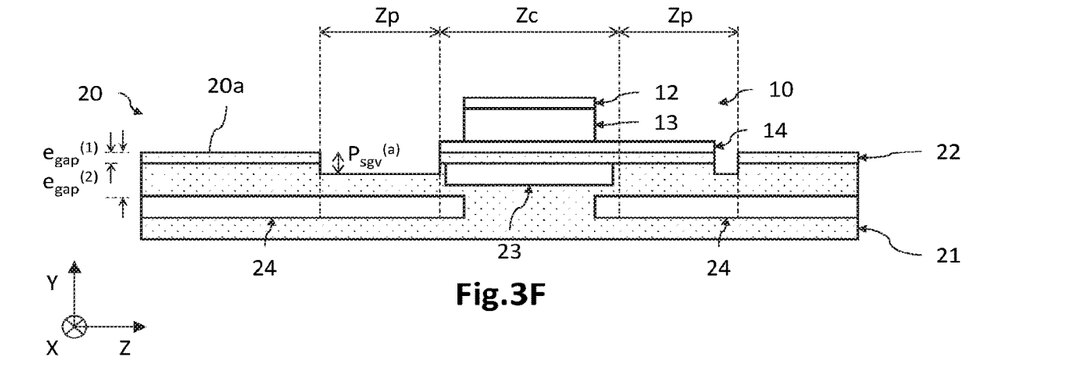

With reference to FIG. 3F, the die 10 is structured with a view to producing the optoelectronic component. To this end, dry etching is carried out to remove the segment of the die 10 not coated with the hard mask 31. The dry etching may for example be reactive ion etching (RIE). In this example, it is essentially anisotropic and here results in a substantially zero lateral over-etch. The dry etching ensures a local etch of the p-doped InP semiconductor layer 12 and of the active layer 13, and here stops on the n-doped InP semiconductor layer 14. The hard mask 31 is then removed.

In so far as the peripheral region Zp has a free surface 25, the dry etching results in vertical over-etching of the free surface 25 of the receiving substrate 20 over a distance $P_{sgv}^{(a)}$. In this example, the fabricating process comprises two steps of dry etching, which each lead to a vertical over-etch of values $P_{sgv}^{(a)}$ and $P_{sgv}^{(b)}$. Thus, the threshold value $P_{th}$ is here substantially equal to the sum of $P_{sgv}^{(a)}$ and of $P_{sgv}^{(b)}$. The threshold value $P_{th}$ may be substantially equal to 150 nm, when $P_{sgv}^{(a)}$ and $P_{sgv}^{(b)}$ are each of the order of 75 nm.

However, in so far as the first waveguide 23 is located solely in the central region Zc, it is not damaged by the vertical over-etch $P_{svg}^{(a)}$ because it is protected by the presence of the die 10. Furthermore, in so far as the second waveguide 24 is located in the peripheral region Zp but with a spacing $e_{gap}^{(2)}$ larger than $P_{th}$, it is also not damaged by the vertical over-etch $P_{sgv}^{(a)}$, which is in sufficient to reach it.

Figure 3G:
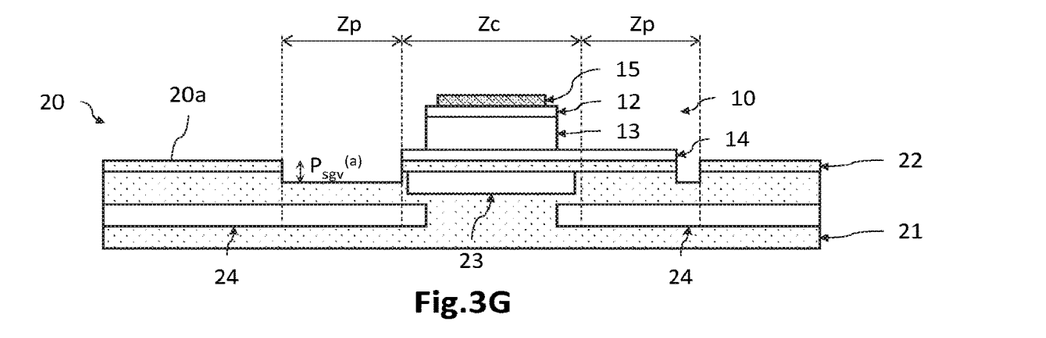

With reference to FIG. 3G, an electrical contact 15 is produced on the p-doped InP semiconductor layer 12. This electrical contact 15 allows an electrical pump current to be injected into the laser diode.

Figure 3H:
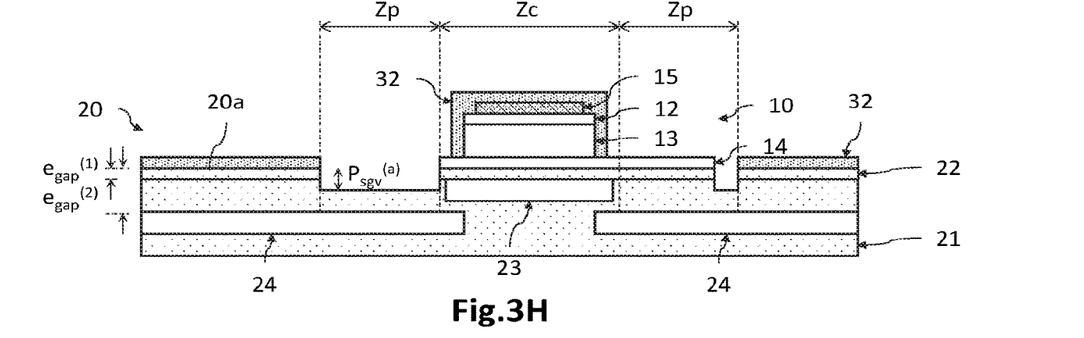

With reference to FIG. 3H, a second hard mask 32 is deposited with a view to structuring the n-doped InP semiconductor layer 14. The hard mask 32 is for example made of silicon nitride and covers the electrical contact 15, the p-doped semiconductor layer 12, the active layer 13, and a peripheral portion of the n-doped semiconductor layer 14. In this example, the hard mask 32 extends so as to encircle the actual transfer region $Zr_e$, although this is not necessary insofar as the second waveguide 24 has a spacing $e_{gap}^{(2)}$ larger than $P_{th}$: it is therefore safe from local degradation during the next dry etch. Protection outside of the actual transfer region $Zr_e$ is useful when the integrated photonic circuit comprises waveguides having a spacing $e_{gap}$ smaller than $P_{sgv}^{(b)}$.

Figure 3I:
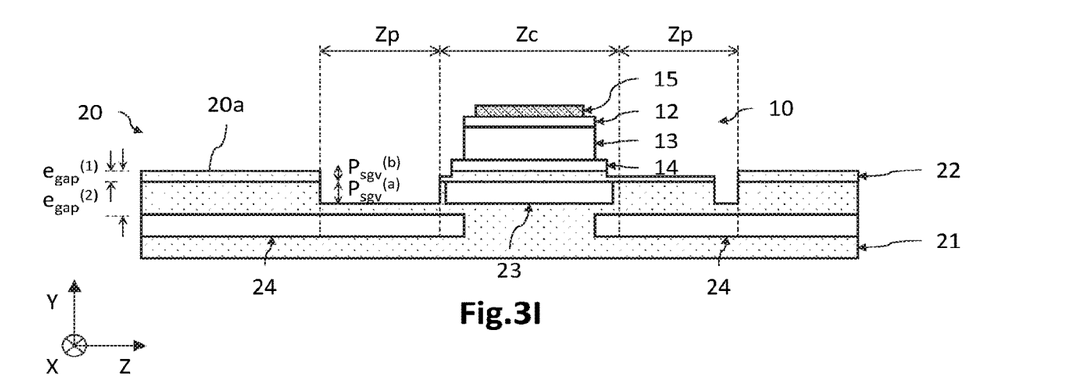

With reference to FIG. 3I, the n-doped InP semiconductor layer 14 is structured with a view to finalizing the production of the laser diode. To this end, dry etching is once more carried out to remove the segments of n-doped InP semiconductor layer 14 which are not coated with the hard mask 32. The dry etching may for example be reactive ion etching (RIE). In this example, it is essentially anisotropic and here results in a substantially zero lateral over-etch. The dry etching results in local etching of the n-doped InP semiconductor layer 14. The hard mask 32 is then removed.

The dry etching causes further vertical over-etching of the free surface 25 of the receiving substrate 20, of a value $P_{sgv}^{(b)}$, this over-etch adding to the preceding vertical over-etch a value $P_{sgv}^{(a)}$. The vertical over-etch of the free surface 25 of the peripheral region Zp of the receiving substrate 20 then reaches the threshold value $P_{th}$.

However, in so far as the first waveguide 23 is solely located in the central region Zc, it is not damaged by this new vertical over-etch of value $P_{sgv}^{(b)}$. Furthermore, in so far as the second waveguide 24 is located in the peripheral region Zp with a spacing $e_{gap}^{(2)}$ larger than $P_{th}$, it is also not damaged by this vertical over-etch of value $P_{sgv}^{(b)}$.

Thus, the fabricating process makes it possible to prevent the one or more various dry etches employed, which induce a vertical over-etch of the free surface 25 of the receiving substrate 20, from degrading the integrated waveguide, and in particular the first and second integrated waveguides. The performance of the photonic chip 1 is therefore maintained.

Particular embodiments have just been described. Various variants and modifications will appear obvious to those skilled in the art.

Thus, a given die 10 may allow a plurality of laser diodes to be produced. By way of example, each laser diode may be a ridge diode, or even a vertical-cavity surface-emitting laser (VCSEL).

The fabricating process may allow a plurality of photonic chips to be produced on the same receiving substrate 20. It then comprises a step of dicing the receiving substrate 22 to singulate the photonic chips.

In the example of FIGS. 3A-3I, the second waveguide 24 also extends out of the actual transfer region $Zr_e$. As a variant, the second waveguide 24 may mainly lie in the peripheral region Zp, and the integrated photonic circuit may then comprise at least one third waveguide, superposed along the Y-axis on and optically coupled to the second waveguide 24, and having a spacing $e_{gap}^{(3)}$ with respect to the upper face 20a of the receiving substrate 20 that is smaller than the threshold value $P_{th}$. This third waveguide may be coplanar with the first waveguide 23. It is then located outside of the actual transfer region $Zr_c$, so as to be protected from the vertical over-etching of the receiving substrate 20 induced by the various steps of dry etching.

In the case where the optoelectronic component is a laser diode, it may be hybrid and then comprise reflectors bounding the optical cavity of the laser source located in the receiving substrate 20. Thus, in the case of a distributed-Bragg-reflector (DBR) laser, the optical cavity is bounded by two Bragg gratings located in the first waveguide 23, or as a variant in the second (or third) waveguide. More precisely, two second waveguides are optically coupled to the first waveguide 23, and each comprise one Bragg mirror. In the case of a distributed-feedback (DFB) laser, a given Bragg grating extends, in the first waveguide 23, over the entire length of the optical cavity.

The invention claimed is:

1. A process for fabricating a photonic chip comprising at least one optoelectronic component placed on a receiving substrate and optically coupled to a first integrated waveguide and a second integrated waveguide,
    the first integrated waveguide being located in the receiving substrate at a depth smaller or equal to a threshold value,
    the second integrated waveguide being located in the receiving substrate at a depth larger than the threshold value,
    the process comprising the following steps:
    defining an actual transfer region on an upper face of the receiving substrate in which a die of the optoelectronic component is to be entirely located, the transfer region comprising: a central region having predefined dimensions Lc, lc in a plane of the receiving substrate, said central region being configured to be entirely covered by the die following a step of transferring the die to the receiving substrate, and a peripheral region surrounding the central region and configured to be partially covered by the die following the transferring step due to a positioning uncertainty, the actual transfer region having predefined dimensions preset on the basis of the dimensions Lc, lc and of the positioning uncertainty;
    producing the die, with initial dimensions that are preset on the basis of the dimensions Lc, lc and of the positioning uncertainty;
    producing the receiving substrate comprising:
        the first integrated waveguide, which lies solely in the central region; and
        the second integrated waveguide, which is superposed on and optically coupled to the first integrated waveguide;
    transferring the die to the actual transfer region of the receiving substrate, the central region then being entirely covered by the die and the peripheral region including a first free surface not covered by the die;
    depositing an etch mask, on the one hand on a segment of the die, and on the other hand around the actual transfer region, the peripheral region including a second free surface not covered by the etch mask; and
    producing the optoelectronic component from the die, by dry etching of a free segment of the die that is not coated by the etch mask, the second free surface of the peripheral region being etched to a depth smaller than or equal to the threshold value.

2. The fabricating process according to claim 1, wherein the first integrated waveguide has a first spacing, with respect to the upper face, smaller than the threshold value.

3. The fabricating process according to claim 1, wherein the receiving substrate comprises a third integrated waveguide, which is superposed on and optically coupled to the second integrated waveguide, and which lies outside of the actual transfer region and has a third spacing, with respect to the upper face, smaller than the preset threshold value PA.

4. The fabricating process according to claim 1, wherein, following the step of producing the die, the die has initial dimensions at least equal to $Lc+2d_{ip}$, $lc+2d_{ip}$, respectively.

5. The fabricating process according to claim 1, wherein the actual transfer region has dimensions at least equal to $Lc+4d_{ip}$, $lc+4\ d_{ip}$, respectively.

6. The fabricating process according to claim 1, comprising, before the step of producing the optoelectronic component, a step of removing a growth substrate of the die by wet etching, the wet etching resulting in lateral over-etching of the die in a plane parallel to the receiving substrate over a nonzero distance, the die then having initial dimensions that are furthermore preset on the basis of the nonzero distance.

7. The fabricating process according to claim 1, comprising a step of producing a plurality of optoelectronic components from the same die, each optoelectronic component being coupled to a corresponding first integrated waveguide.

8. The fabricating process according to claim 1, wherein the optoelectronic component is a laser diode, a photodiode or an electro-optical modulator.

9. The fabricating process according to claim 1, wherein the die is made based on a III-V semiconductor compound.

10. The fabricating process according to claim 1, the optoelectronic component being a DFB laser diode, a Bragg mirror being placed in the first integrated waveguide.

11. The fabricating process according to claim 1, the optoelectronic component being a DBR laser diode, two Bragg mirrors bounding an optical cavity of the laser diode and being placed in second integrated waveguides that are each superposed on and optically coupled to one end of said first integrated waveguide.

12. The fabricating process according to claim 1, comprising fabricating a plurality of photonic chips from the same receiving substrate.

13. The fabricating process according to claim 1, wherein producing the optoelectronic component comprises etching the receiving substrate excluding any region of the receiving substrate directly overlying any portion of the first integrated waveguide.

14. The fabricating process according to claim 1, comprising forming the second integrated waveguide with a second spacing with respect to the upper face larger than the first spacing.

15. The fabricating process according to claim 14, comprising forming a third integrated waveguide having a third spacing with respect to the upper face is larger than the first spacing.

16. The fabricating process according to claim 15, wherein the third integrated waveguide has at least a portion located in the central region.

17. The fabricating process according to claim 15, wherein the third integrated waveguide has at least a portion located within the central region to overlap with the first integrated waveguide.

18. The fabricating process according to claim 1, wherein the second integrated waveguide has at least a portion located within the central region.

19. The fabricating process according to claim 1, wherein the second integrated waveguide has at least a portion located within the central region to overlap with the first integrated waveguide.

20. The fabricating process according to claim 1, wherein the first and second integrated waveguides are not etched during the dry etching.

21. The fabricating process according to claim 1, comprising:
- removing a substrate of the die including over-etching a lateral portion of the die, the second free surface including a portion of the upper face of the receiving substrate exposed during the over-etching.

* * * * *